United States Patent [19]
Dobrovolny

[11] Patent Number: 5,923,221
[45] Date of Patent: Jul. 13, 1999

[54] OSCILLATOR FOR DIGITAL ATV SIGNALS HAVING LOW PHASE NOISE

[75] Inventor: Pierre Dobrovolny, North Riverside, Ill.

[73] Assignee: Zenith Electonics Corporation, Glenview, Ill.

[21] Appl. No.: 08/815,560

[22] Filed: Mar. 12, 1997

[51] Int. Cl.⁶ ..................................................... H03B 5/12
[52] U.S. Cl. .................................. 331/117 D; 331/117 R; 331/177 R; 331/177 V
[58] Field of Search ............................ 331/117 R, 117 D, 331/107 R, 177 B, 177 R, 107 SL

[56] References Cited

U.S. PATENT DOCUMENTS

| | | | |
|---|---|---|---|
| 4,146,850 | 3/1979 | Fache et al. ............................. | 331/117 |
| 5,502,420 | 3/1996 | Barclay ................................ | 331/117 R |
| 5,564,100 | 10/1996 | Huang et al. ........................ | 331/117 V |
| 5,712,596 | 1/1998 | Van Amesfoort .................... | 331/177 V |

Primary Examiner—Son T. Dinh

[57] ABSTRACT

An oscillator operable in the gigaHertz range includes a transistor having an emitter coupled to a tank circuit and an additional feedback path coupling the tank circuit back to the base of the transistor. The inductive elements of the tank circuit are in printed foil form as is a transmission line that provides the additional feedback path. This arrangement improves the phase noise characteristics of the oscillator while extending its operating frequency range.

5 Claims, 2 Drawing Sheets

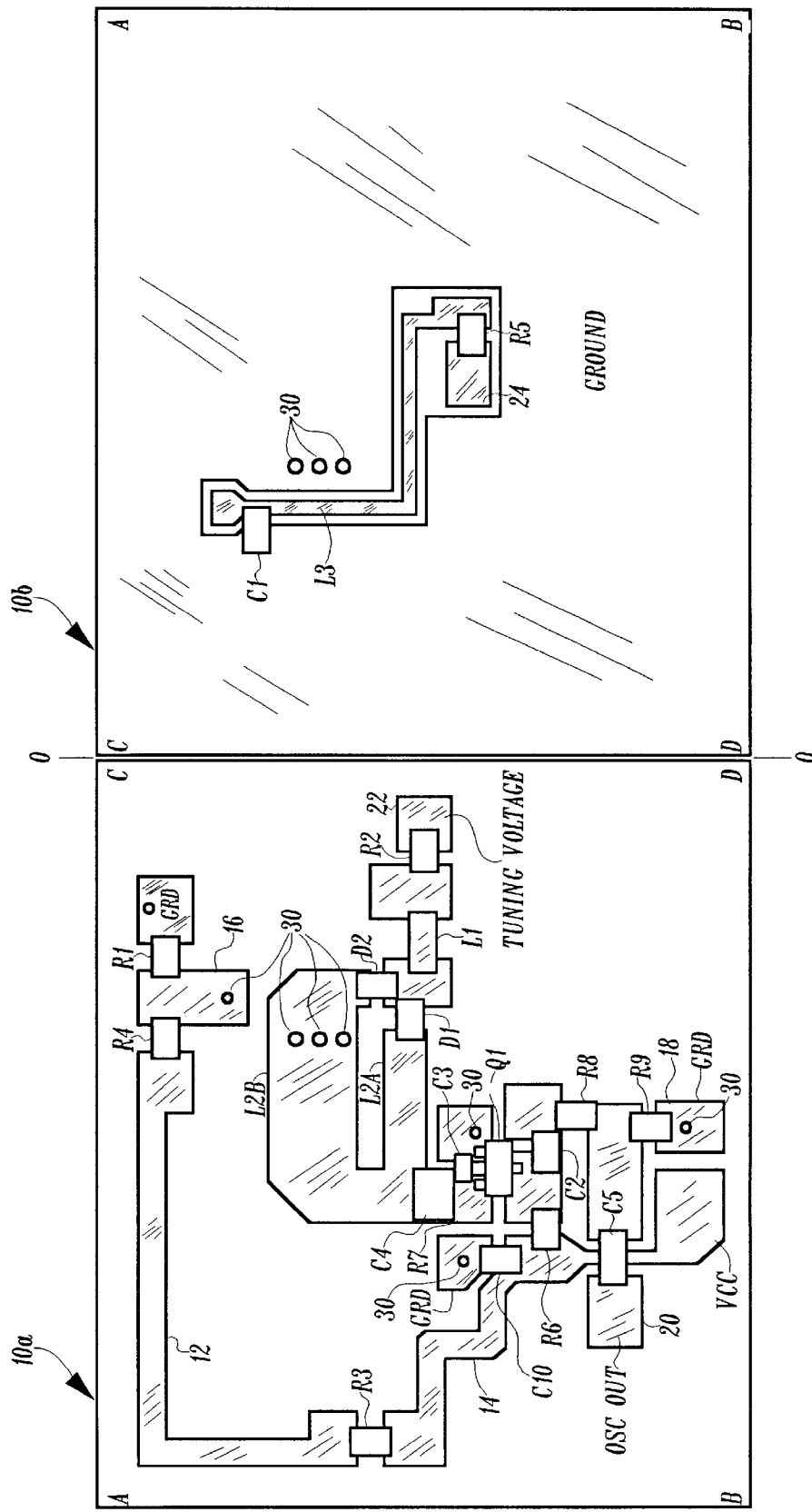

OSCILLATOR FOR DIGITAL ATV SIGNALS HAVING LOW PHASE NOISE

BACKGROUND OF THE INVENTION AND PRIOR ART

This invention is directed to high frequency oscillators operable in the gigaHertz frequency range and particularly to such oscillators for use with digital ATV (advanced television) signals.

When processing digital ATV signals, the phase noise introduced by the tuner oscillator is critical. Also, especially when the oscillator operates at 1 or 2 gigaHertz and higher, it is often mechanically unstable, i.e., it is highly susceptible to "microphonics" or ringing due to mechanical stimulation. The oscillator of the present invention uses additional feedback from the tank circuit to improve the oscillator's phase noise (which also extends its operating frequency) and printed foil inductive elements (transmission lines) for providing mechanical stability.

OBJECTS OF THE INVENTION

A principal object of the invention is to provide a novel high frequency oscillator.

Another object of the invention is to provide a high frequency oscillator for use with digital ATV signals.

A further object of the invention is to provide an oscillator operable in the gigaHertz range that is stable, inexpensive and that exhibits low phase noise.

BRIEF DESCRIPTION OF THE DRAWINGS

These and other objects and advantages of the invention will become apparent upon reading the following description in conjunction with the drawings, in which:

FIGS. 2 and 3 are enlarged opposite side views of the printed circuit board oscillator of the invention.

DESCRIPTION OF THE PREFERRED EMBODIMENT

Figure 1:
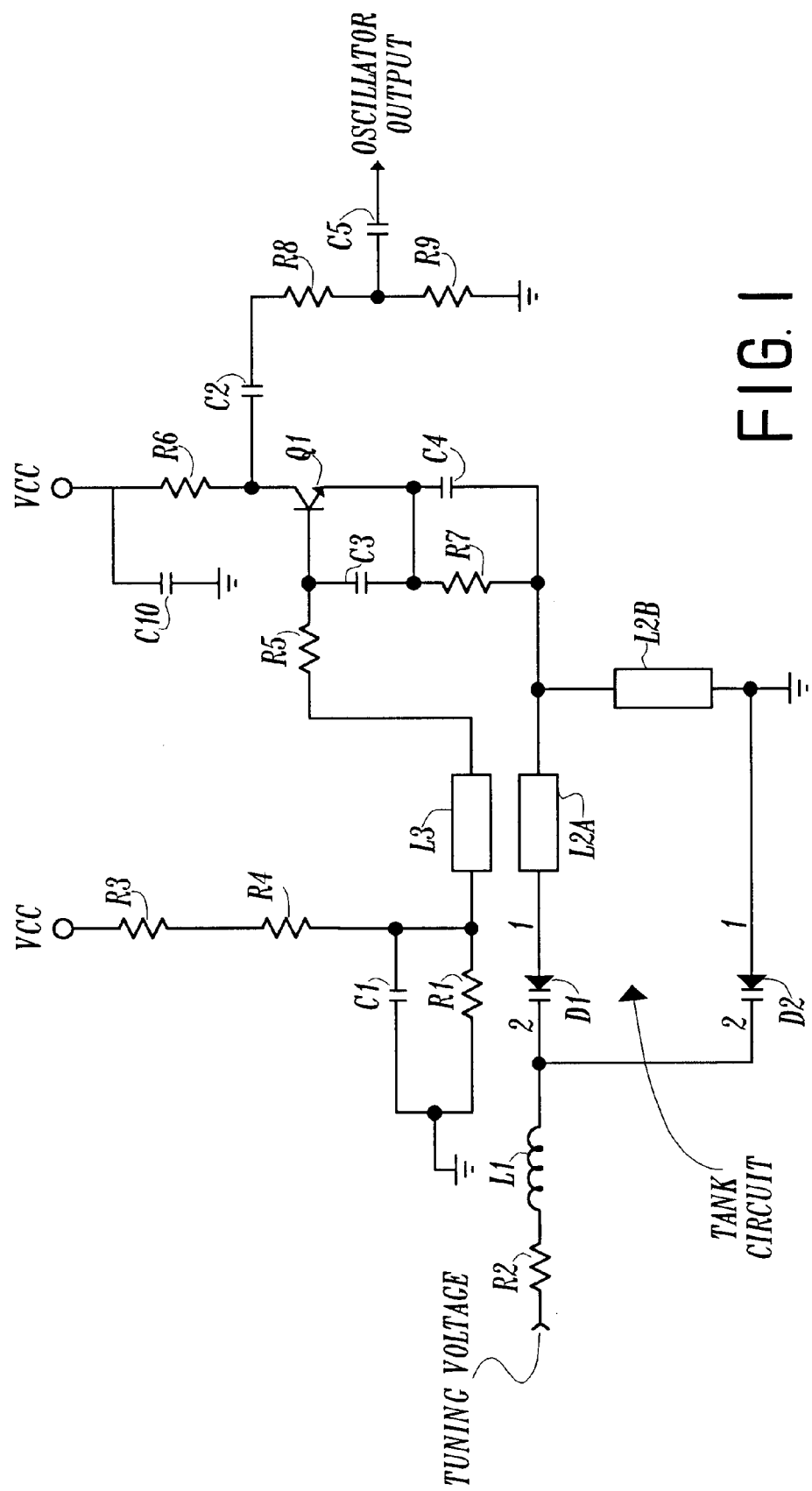
FIG. 1 is a schematic diagram of the inventive oscillator.

Referring to the schematic diagram of FIG. 1., an NPN oscillator transistor Q1 has its collector connected to a source of DC operating voltage Vcc through a resistor R6. Vcc is bypassed to ground by a capacitor C10. A capacitor C3, as part of the oscillator feedback circuit, connects the bass and emitter of the transistor, with the emitter being connected via the parallel combination of a resistor R7 and a capacitor C4 to a tank circuit. The tank circuit includes a pair of primary inductive elements L2A and L2B connected in parallel with a pair of oppositely polarized varactor diodes D1 and D2. The junction of the varactor diodes receives a tuning voltage through a series-connected resistor R2 and an inductive element L3. The output of the oscillator transistor Q1 is supplied from its collector to a series connection of a DC decoupling capacitor C2 and a pair of resistors R8 and R9 forming together with a resistor R6, an AC PI type attenuator to improve the oscillator pulling characteristics. The output is taken from the junction of resistors R8 and R9 through a capacitor C5.

An additional feedback circuit is established between the tank circuit and the base of transistor Q1 (in addition to the one provided by the intrinsic capacitances of Q1 and capacitor C3) A DC voltage divider, formed by a series connection of three resistors, R3, R4 and R1 between Vcc and ground, provides biasing for the base of Q1. A capacitor C1 is connected in parallel with resistor R1, which has one terminal connected to ground to reduce any noise carried by Vcc. An inductive element L3, which is coupled to L2A, is connected to the junction of R1 and C1 and a resistor R5 (approximately 10 ohms) connects the other terminal of L3 to the base of oscillator transistor Q1 to close the additional feedback path.

In accordance with the invention, the inductive elements L2A, L2B and L3 are coupled, printed, transmission lines that comprise foil patterns on an insulating substrate such as a printed circuit board. Further, inductive element L3 is positioned to have a mutual coupling with inductive element L2A of the tank circuit and connected such that a negative mutual coupling coefficient is obtained between the tank circuit and inductive element L3. The actual arrangement of the oscillator on a printed circuit board is illustrated in enlarged form) in FIGS. 2 and 3.

The printed circuit board in FIGS. 2 and 3 includes a top surface 10a and a bottom surface 10b, with the top surface having a foil pattern including two relatively long interconnecting strips 12 and 14 (carrying only DC) and a plurality of connecting and interconnecting pads or lands, such as pads 16, 18, 20 and 22. A number of plated-through holes 30 are disposed about the circuit board for connecting elements of the top surface 10a to elements or to ground on the bottom surface 10b, in accordance with well-known practice. The transistor, varactor diodes, and various resistor, capacitor and inductive elements are shown as they are connected to the foil patterns. It should be particularly noted that the inductive elements are formed by portions of the conductive foil on a circuit board. By folding sheet two of the drawings along line 0—0, FIG. 3 will underlie FIG. 2 with the points A, B, C and D of each figure in respective alignment. The orientation of inductive element L3 with respect to the inductive elements L2A and L2B of the tank circuit establishes a negative mutual coupling coefficient between L3A and L3 with the resulting voltage being applied to the base of oscillator transistor Q2. It will be noted that the major part of bottom surface lob is a metallic ground plane. It will also be appreciated that the circuit board and elements are housed in a shielded environment, not shown, with suitable attention being paid to proper lead placement and grounding techniques as is well known in the art of oscillators designed for operation in the gigaHertz frequency range.

What has been described is a novel oscillator that operates in the gigaHertz frequency range to be used for processing of digital ATV signals. The oscillator exhibits low phase noise, extended range and relative freedom from uncorrectable mircrophonics. Numerous changes in the described embodiment of the invention will be apparent to those skilled in the art without departing from its true spirit and scope. The invention is to be limited only as defined in the claims.

What is claimed is:

1. A method of extending the frequency range of an oscillator operable in the gigaHertz range, comprising:

providing a tunable tank circuit coupled to the emitter of an oscillator transistor;

supplying additional feedback from the tank circuit to the base of the oscillator transistor;

wherein the tunable tank circuit includes a first inductive element and wherein the supplying comprises:

establishing a mutual coupling of the first inductive element with a second inductive element;

obtaining a negative coupling coefficient between the first and the second inductive element; and applying the resulting additional feedback voltage across the base-ground circuit of the oscillator transistor.

2. The method of claim 1, wherein the first inductive element comprises a printed foil pattern on an insulating substrate and wherein the second inductive element comprises a printed foil pattern on the obverse side of the insulating substrate juxtaposed to the first foil pattern.

3. An oscillator operable in the gigaHertz frequency range comprising:

an oscillator transistor having a base and an emitter;

a tunable tank circuit coupled to said emitter of said transistor;

a transmission line coupled to said tunable tank circuit for developing a voltage from the current circulating in said tunable tank circuit; and means for applying said voltage to said base of said transistor in a positive feedback manner to extend the frequency response characteristic of said oscillator transistor:

wherein said tunable tank circuit includes a first inductive element, and further comprising:

a second inductive element in said coupled transmission line; and means for positioning said second inductive element in a negative mutual coupling coefficient relationship with said first inductive element.

4. The oscillator of claim 3, further including:

an insulating substrate;

said first inductive element comprising a first foil pattern on said insulating substrate; and said second inductive element comprising a second foil pattern on the obverse side of said insulating substrate juxtaposed to said first foil pattern.

5. An oscillator operable in the gigaHertz frequency range comprising:

an oscillator transistor having a base and an emitter;

a tunable tank circuit including a first inductive element coupled to said emitter of said transistor;

a coupled transmission line including a second inductive element coupled to said first inductive element in said tunable tank circuit for developing a voltage from the current circulating in said tunable tank circuit;

means for positioning said second inductive element in a negative mutual coupling coefficient relationship with said first inductive element;

an insulating substrate;

said first inductive element comprising a first foil pattern on said insulating substrate;

said second inductive element comprising a second foil pattern on the obverse side of said insulating substrate juxtaposed to said first foil pattern; and means for applying said voltage to said base of said transistor in a positive feedback manner to extend the frequency response characteristic of said oscillator transistor.

* * * * *